United States Patent
Nagashima

(10) Patent No.: US 9,966,288 B2
(45) Date of Patent: May 8, 2018

(54) STRUCTURE FOR FASTENING TOGETHER RESIN MEMBERS IN SUBSTRATE STORING CONTAINER

(71) Applicant: MIRAIAL CO., LTD., Tokyo (JP)

(72) Inventor: Tsuyoshi Nagashima, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 0 days. days.

(21) Appl. No.: 15/028,537

(22) PCT Filed: Oct. 16, 2013

(86) PCT No.: PCT/JP2013/078108
§ 371 (c)(1),
(2) Date: Apr. 11, 2016

(87) PCT Pub. No.: WO2015/056317
PCT Pub. Date: Apr. 23, 2015

(65) Prior Publication Data
US 2016/0233119 A1    Aug. 11, 2016

(51) Int. Cl.
*H01L 21/673* (2006.01)
*B65D 81/113* (2006.01)
*H01L 21/677* (2006.01)

(52) U.S. Cl.
CPC ...... *H01L 21/67379* (2013.01); *B65D 81/113* (2013.01); *H01L 21/6773* (2013.01); *H01L 21/67369* (2013.01); *H01L 21/67386* (2013.01); *H01L 21/67724* (2013.01)

(58) Field of Classification Search
CPC ...... B65D 25/24; B65D 77/04; B65D 81/113; B65D 85/00; B65D 85/86; B65D 85/68; H01L 21/027; H01L 21/67; H01L 21/673; H01L 21/67369; H01L 21/67379; H01L 21/67386; H01L 21/677; H01L 21/67724; H01L 21/6773; H01L 21/68; H01L 21/687
USPC .................................................. 206/710–714
See application file for complete search history.

(56) References Cited

U.S. PATENT DOCUMENTS

| 5,706,951 A | 1/1998 | Oinuma et al. |
| 5,887,721 A * | 3/1999 | Betsuyaku ............. B65D 85/00 206/711 |
| 6,293,007 B1 | 9/2001 | Kuriyama et al. |

(Continued)

FOREIGN PATENT DOCUMENTS

| JP | 5-36820 A | 2/1993 |
| JP | 7-307378 A | 11/1995 |
| JP | 10-75092 A | 3/1998 |

(Continued)

*Primary Examiner* — Bryon Gehman
(74) *Attorney, Agent, or Firm* — Muncy, Geissler, Olds & Lowe, P.C.

(57) ABSTRACT

The lower lid includes a bottom plate that supports the substrate storing container and a lower lid peripheral wall that extends upwards from a periphery of the bottom plate. The sleeve member has a tubular shape having an axial center that extends in the vertical direction. The upper lid has a top plate and an upper lid peripheral wall that extends downwards. The lower lid includes device positioning portions. The device positioning portions can engage the positioned portion of the lifting device that lifts, from the lower lid, the substrate storing container which is supported by the lower lid in a state of the upper lid being removed therefrom.

4 Claims, 10 Drawing Sheets

(56) References Cited

U.S. PATENT DOCUMENTS 6,398,476 B1    6/2002  Ando

FOREIGN PATENT DOCUMENTS

| JP | 10-203610 A | | 8/1998 | |
|---|---|---|---|---|
| JP | 2004168324 A | * | 6/2004 | ........... B65D 81/113 |
| JP | 2005-64279 A | | 3/2005 | |
| JP | 2008222263 A | * | 9/2008 | ........... B65D 81/113 |
| JP | 2009-107703 A | | 5/2009 | |
| JP | 2010-98198 A | | 4/2010 | |
| JP | 2010208642 A | * | 9/2010 | ........... B65D 81/113 |
| JP | 2012-164720 A | | 8/2012 | |

* cited by examiner

STRUCTURE FOR FASTENING TOGETHER RESIN MEMBERS IN SUBSTRATE STORING CONTAINER

TECHNICAL FIELD

The present invention relates to a packing structure for packing a substrate storing container that stores substrates such as semiconductor wafers.

BACKGROUND ART

As a container that stores substrates such as semiconductor wafers, a substrate storing container has been known conventionally that has a container main body and a lid body (refer to Japanese Unexamined Patent Application, Publication No. H07-307378). Such a substrate storing container is packed in a packing box for transportation and taken out from the packing box, and then the substrates are taken out from the substrate storing container.

Patent Document 1: Japanese Unexamined Patent Application, Publication No. H07-307378

DISCLOSURE OF THE INVENTION

Problems to be Solved by the Invention

Recently, as the diameter of substrates has become larger, the substrate storing containers storing the substrates tend to become significantly heavy. For this reason, if it is possible to use a lifting device for lifting the substrate storing container when taking the substrate storing container out from the packing box, it can facilitate the removal of the substrate storing container from the packing box.

It is an object of the present invention to provide a packing structure that can take out a substrate storing container easily from a packing box using a lifting device for lifting the substrate storing container.

Means for Solving the Problems

The present invention relates to a packing structure for packing a substrate storing container for storing and transporting substrates made of semiconductor wafers, the packing structure which includes: a packing box including: a lower lid having a bottom plate which supports the substrate storing container and a lower lid peripheral wall which extends upwards from a periphery of the bottom plate; a sleeve member of tubular shape having an axial center that extends in an upper/lower direction; and an upper lid having a top plate and an upper lid peripheral wall which extends downwards from a periphery of the top plate, in which a lower end of the sleeve member is placed on the bottom plate of the lower lid, and the top plate of the upper lid is placed at an upper end of the sleeve member, in which the lower lid includes a device positioning portion, and in which the device positioning portion can engage a positioned portion of a lifting device that lifts, from the lower lid, the substrate storing container which is supported by the lower lid of the packing box in a state of the upper lid being removed therefrom.

Furthermore, it is preferable that the device positioning portion includes an approaching-distancing direction end in an approaching-distancing direction which is a direction perpendicular to a direction connecting the upper lid with the lower lid as well as a direction approaching or distancing with respect to the lower lid, and a regulation-direction one end and a regulation-direction other end in a regulation direction which is a direction connecting the upper lid with the lower lid as well as a direction perpendicular to the approaching-distancing direction.

Furthermore, it is preferable that the device positioning portion includes: at least one first device positioning portion having the approaching-distancing direction end, the regulation-direction one end, and the regulation-direction other end; and at least one second device positioning portion having the approaching-distancing direction end which has a shape different from the first device positioning portion.

It is preferable that the device positioning portion includes at least three first device positioning portion of identical shape having the approaching-distancing direction end, the regulation-direction one end, and the regulation-direction other end, and the first device positioning portions that are adjacent are not arranged so as to be spaced apart at the same interval, but arranged so as to be spaced apart at different intervals.

It is preferable that the positioned portion of the lifting device includes a first positioned portion having an approaching-distancing direction end abutting portion which constitutes an end in the approaching-distancing direction and one end abutting portion which constitutes one end in the regulation direction, and a second positioned portion having the approaching-distancing direction end abutting portion and one other end abutting portion which constitutes one other end in the regulation direction, and the device positioning portion includes a common device positioning portion having the approaching-distancing direction end that the approaching-distancing direction end abutting portion of the first positioned portion and the approaching-distancing direction end abutting portion of the second positioned portion can abut, the regulation-direction one end that the one end abutting portion of the first positioned portion can abut, and the regulation-direction other end that the other end abutting portion of the second positioned portion can abut.

Furthermore, it is preferable that the device positioning portion exists at the lower lid peripheral wall. Furthermore, it is preferable that the lower lid includes a lower lid leg portion that extends downwards from a lower face of the bottom plate, and the device positioning portion exists at the lower lid leg portion. Furthermore, it is preferable to include a lower cushioning material on which the substrate storing container is placed in the packing box.

Effects of the Invention

According to the present invention, it is possible to provide a packing structure that can remove a substrate storing container easily from a packing box using a lifting device for lifting the substrate storing container.

Figure 4:
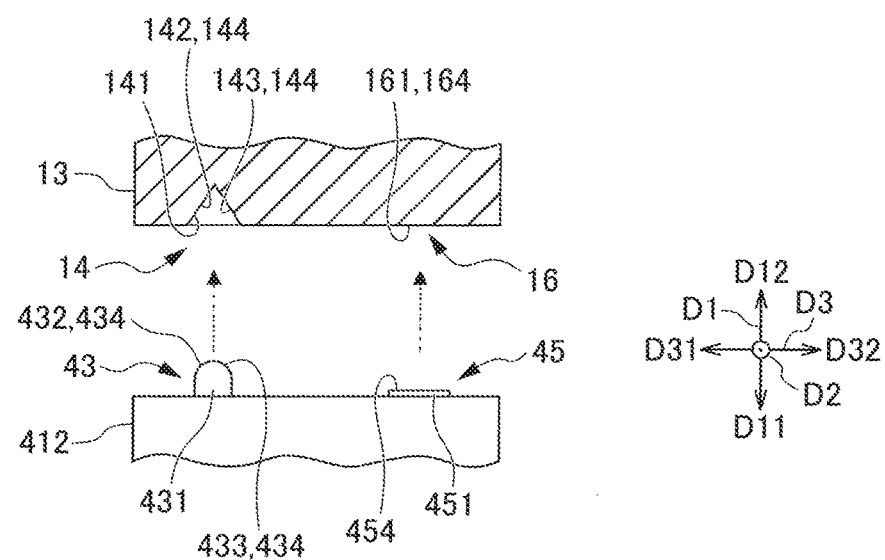
Figure 5:
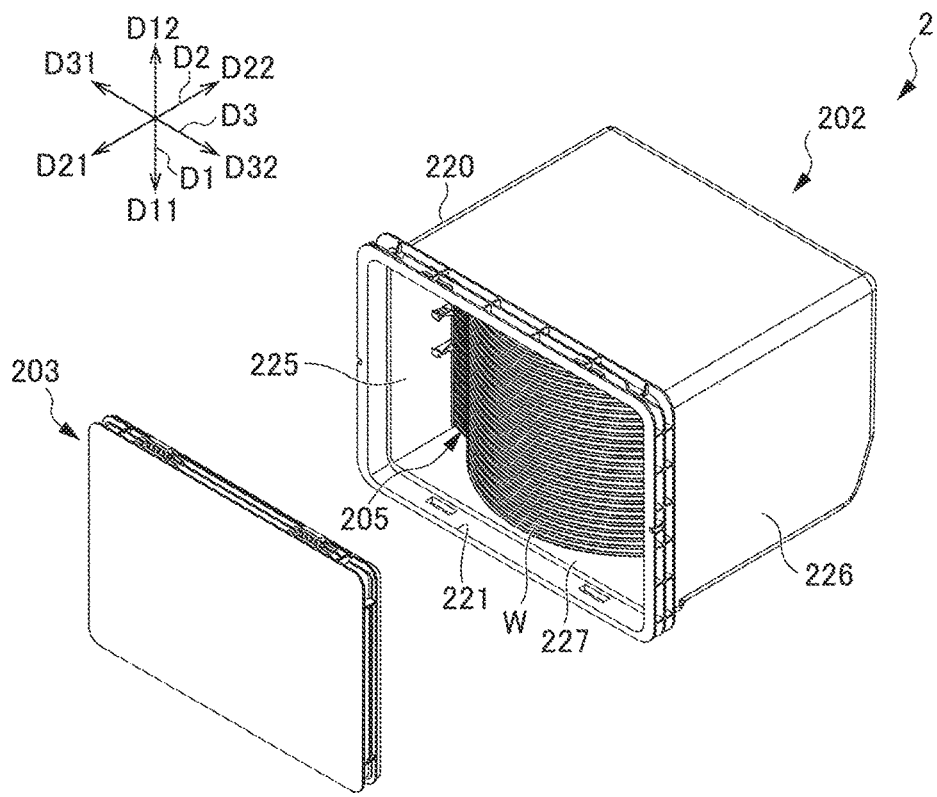
Figure 6:
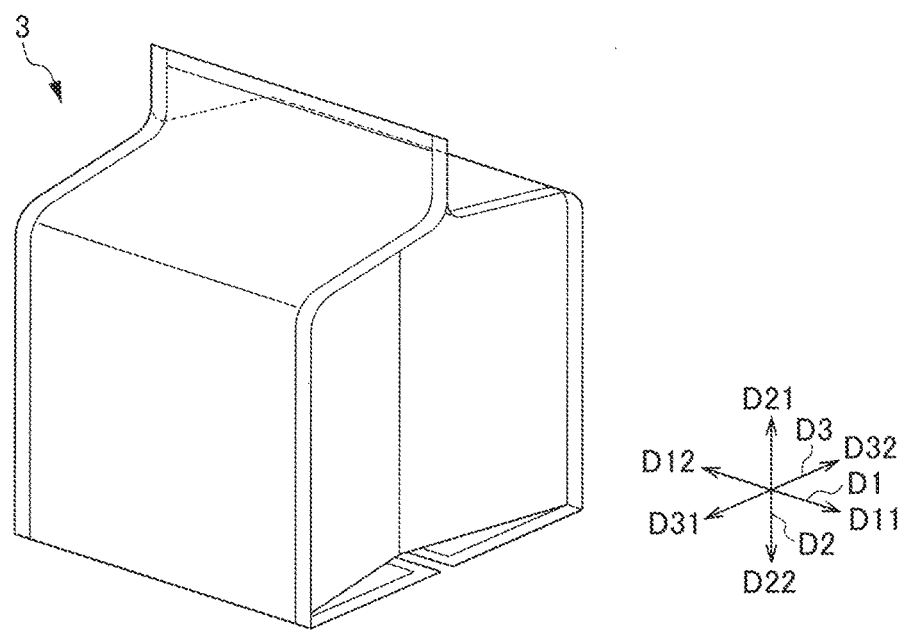
Figure 7:
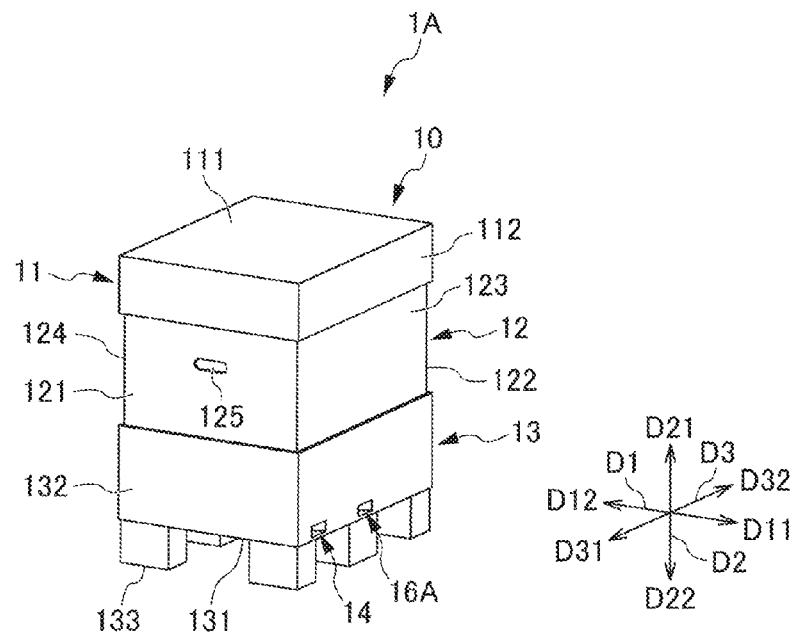
Figure 8:
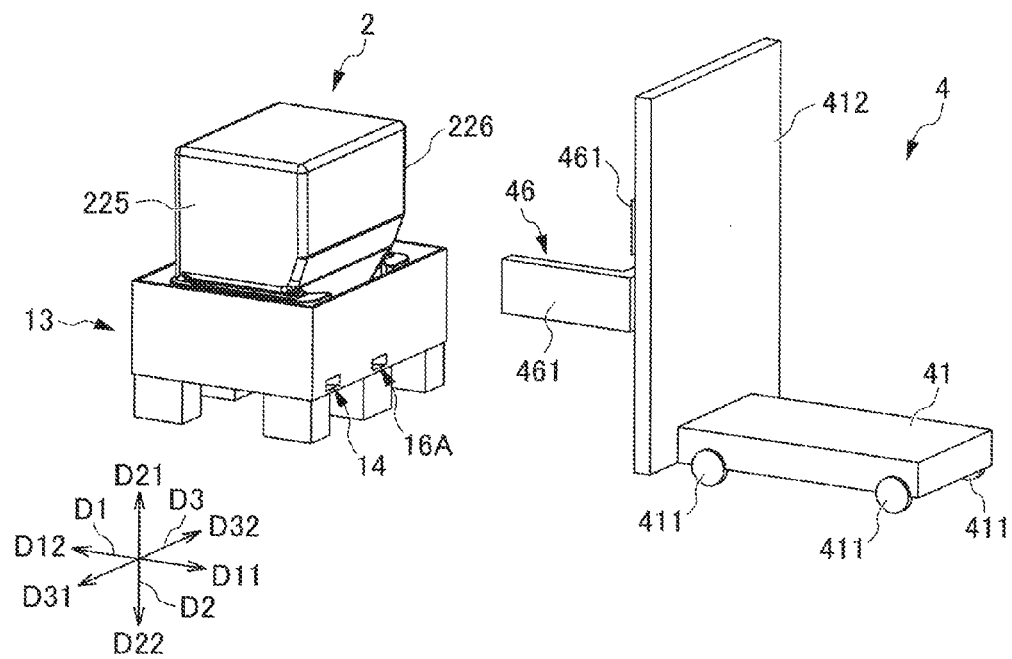
Figure 9:
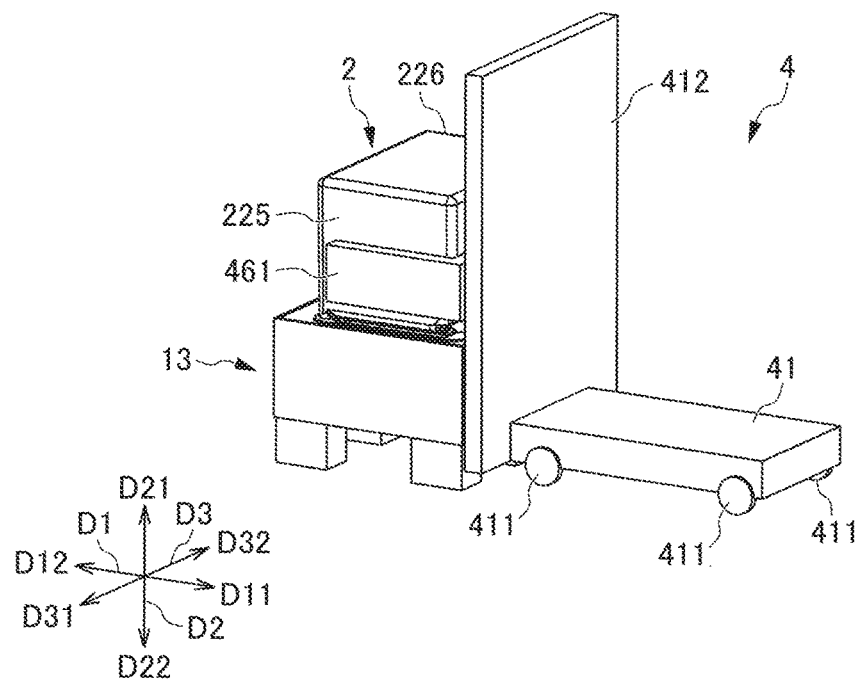
Figure 10:
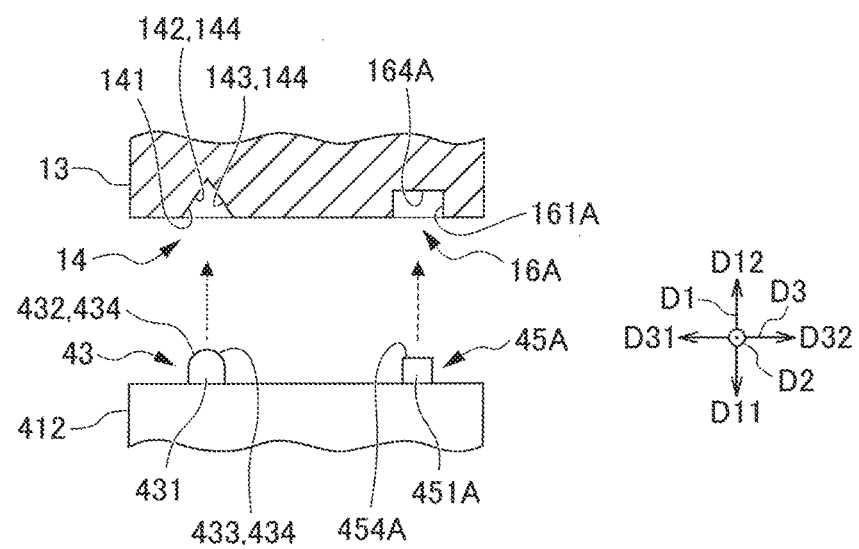
Figure 11:
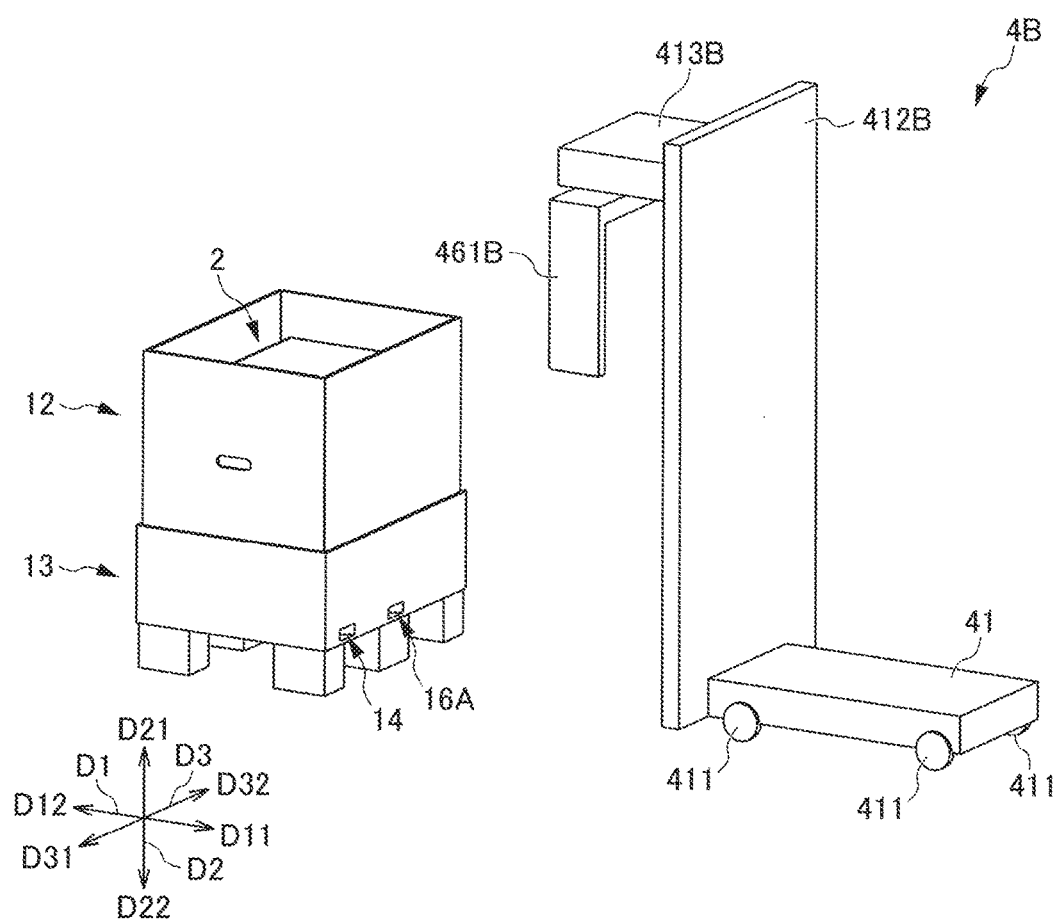
Figure 12:
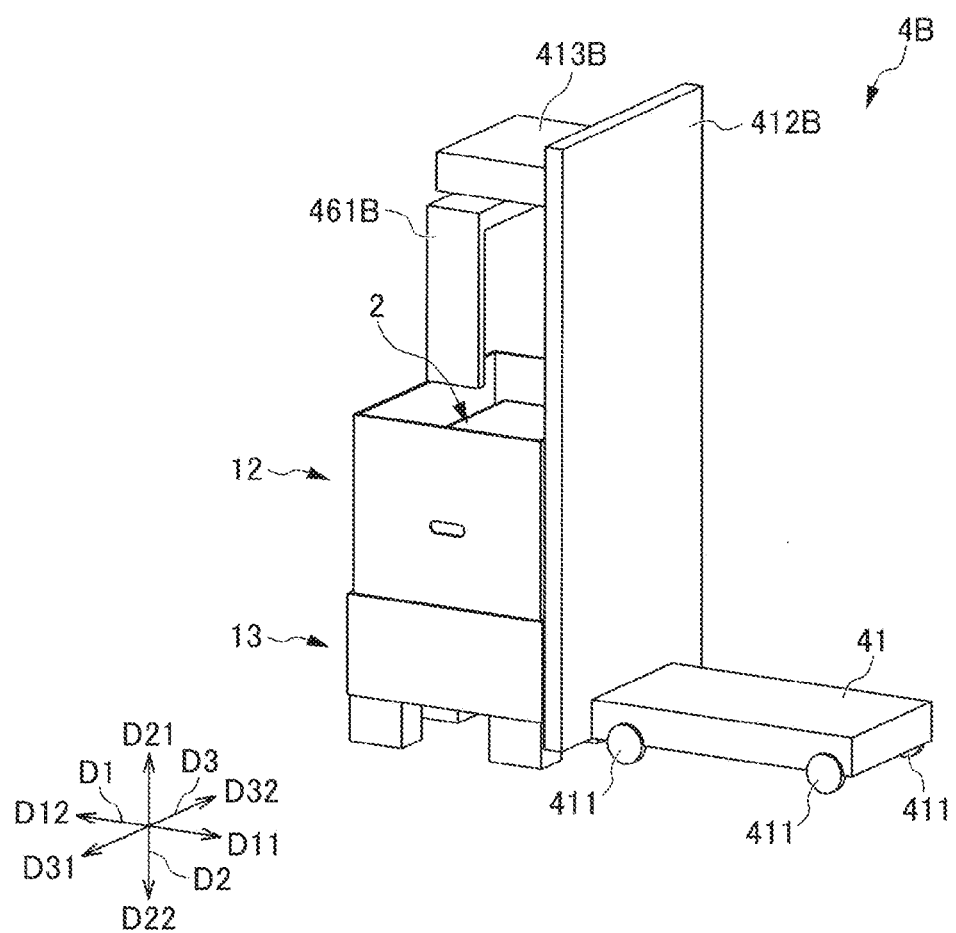
Figure 13:
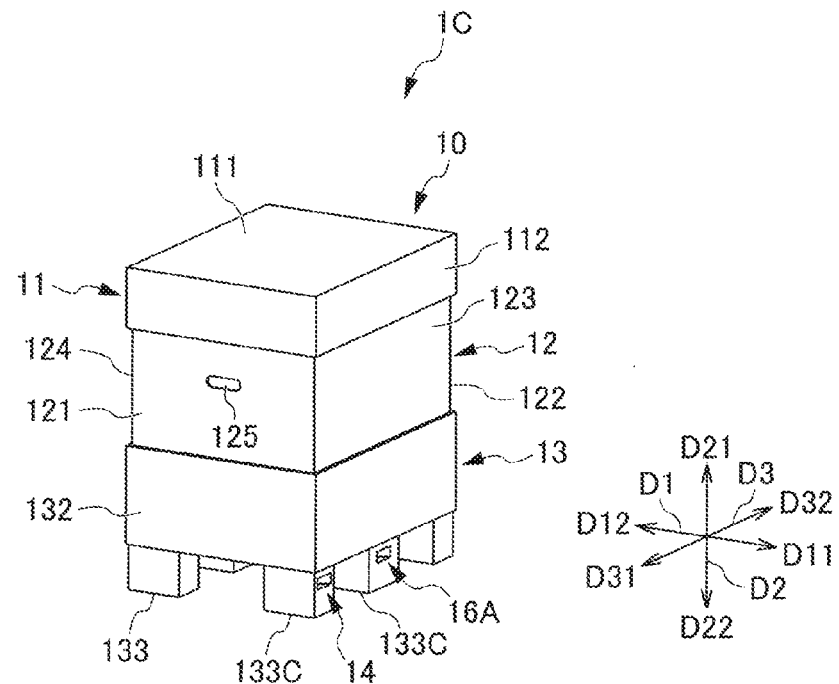
Figure 14:
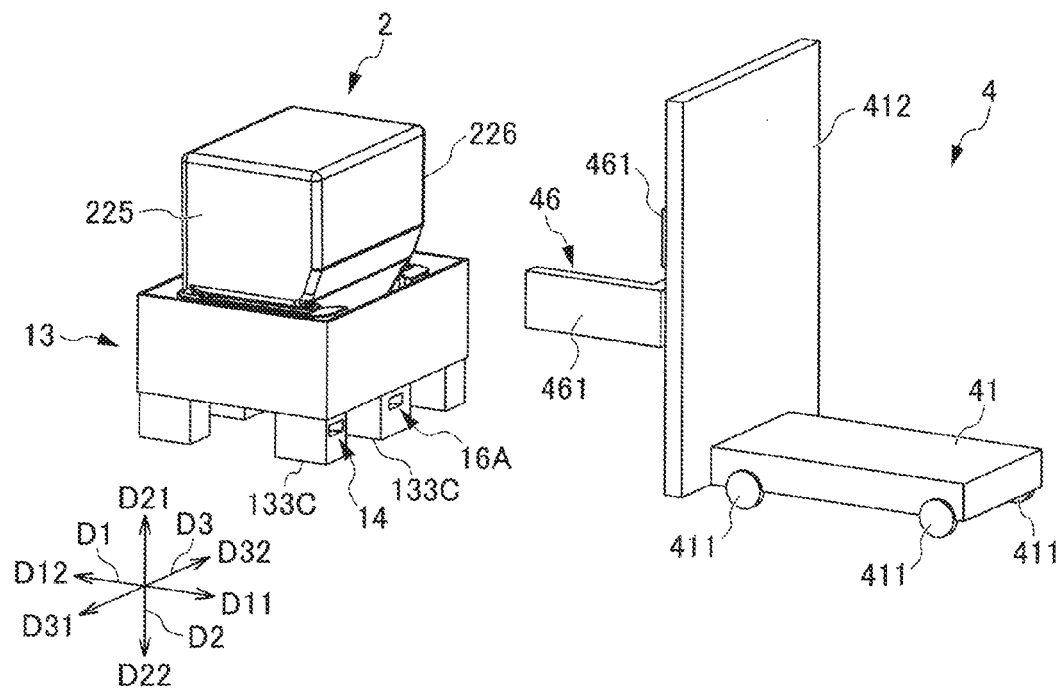
Figure 15:
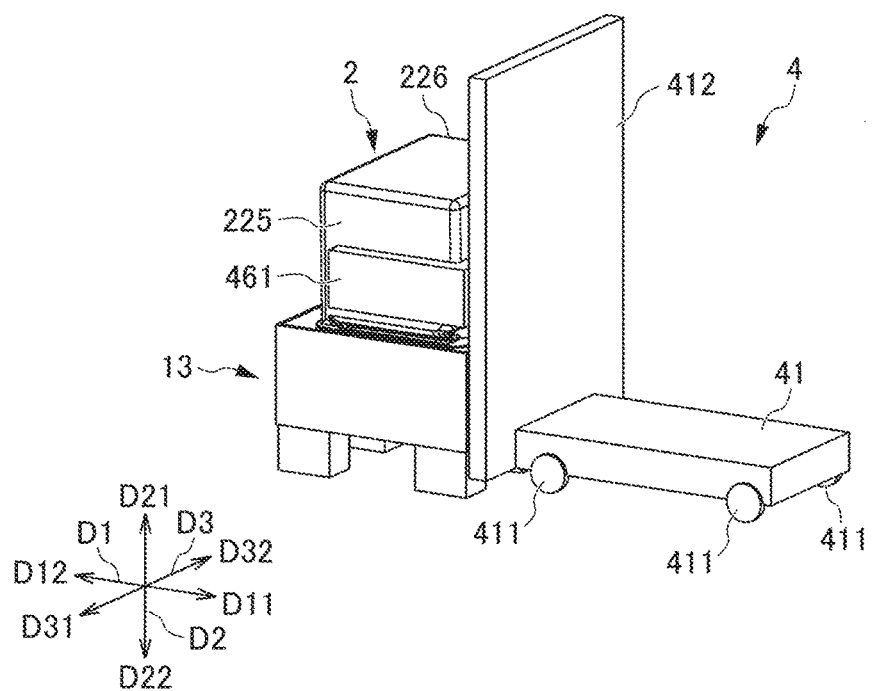
Figure 16:
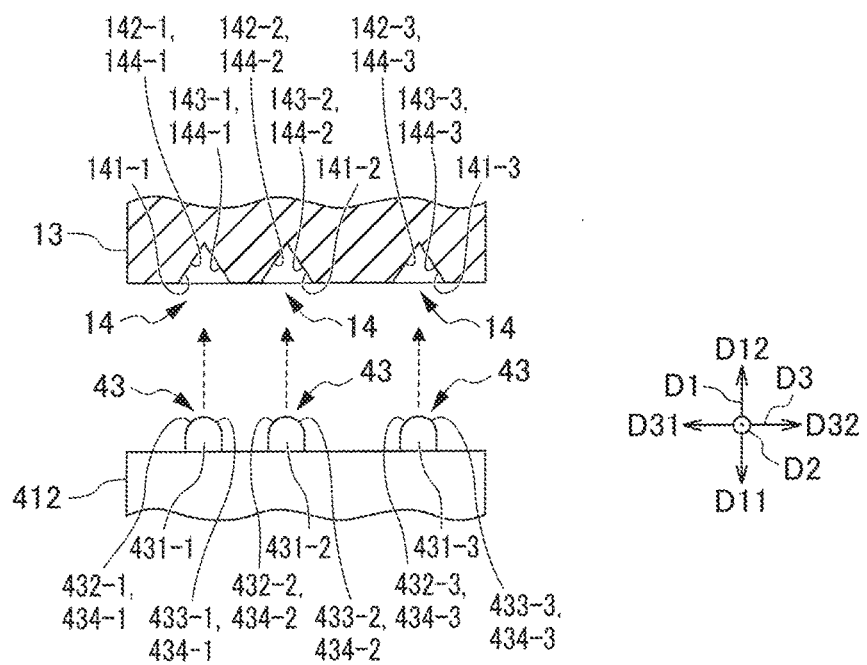
Figure 17:
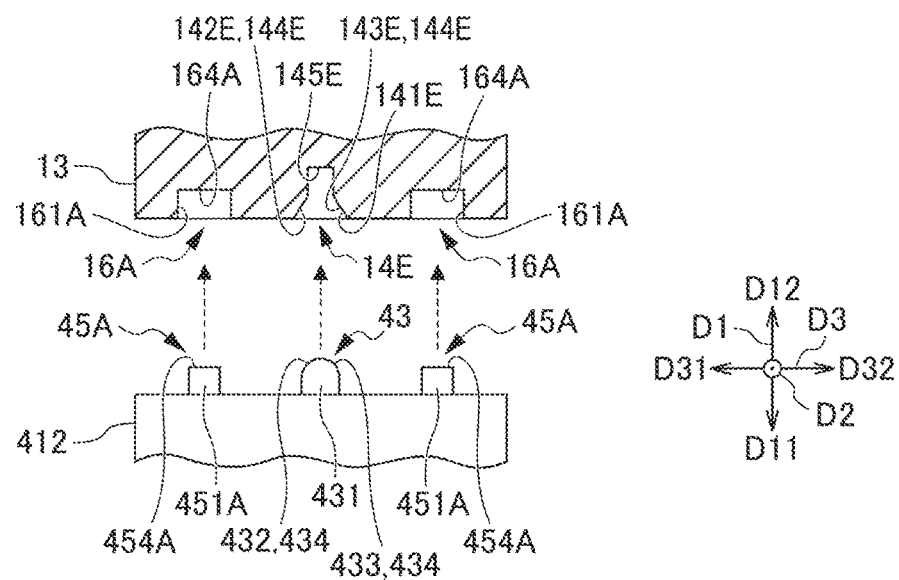
Figure 18:
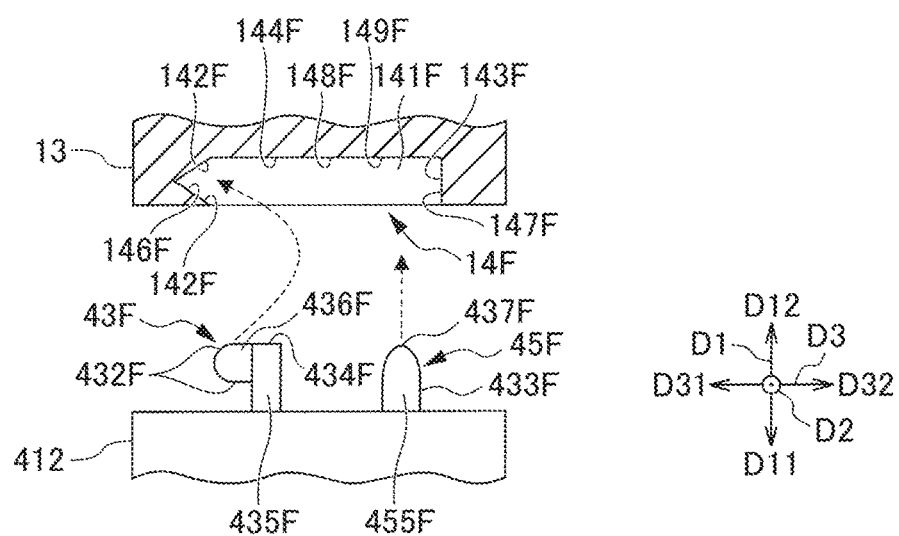

FIG. 4 is a schematic view illustrating a first device positioning portion 14 and a second device positioning portion 16 of a lower lid 13 of the packing structure 1 according to the first embodiment of the present invention;

FIG. 5 is an exploded perspective view illustrating the substrate storing container 2 packed by the packing structure 1 according to the first embodiment of the present invention;

FIG. 6 is a perspective view illustrating a substrate storing container storing bag 3 which stores the substrate storing container 2 packed by the packing structure 1 according to the first embodiment of the present invention;

FIG. 7 is a perspective view illustrating a packing structure 1A according to the second embodiment of the present invention;

FIG. 8 is a perspective view illustrating an aspect in which an upper lid 11 and a sleeve member 12 are removed from the packing structure 1A according to the second embodiment of the present invention;

FIG. 9 is a perspective view illustrating an aspect of lifting a substrate storing container 2 by a lifting device 4 that lifts the substrate storing container 2 from the packing structure 1A according to the second embodiment of the present invention;

FIG. 10 is a schematic view illustrating a first device positioning portion 14 and a second device positioning portion 16 of a lower lid 13 of the packing structure 1A according to the second embodiment of the present invention;

FIG. 11 is a perspective view illustrating an aspect of removing an upper lid 11 from a packing structure 1 according to the third embodiment of the present invention;

FIG. 12 is a perspective view illustrating an aspect of lifting a substrate storing container 2 by a lifting device 4B that lifts the substrate storing container 2 from the packing structure 1 according to the third embodiment of the present invention;

FIG. 13 is a perspective view illustrating a packing structure 1C according to the fourth embodiment of the present invention;

FIG. 14 is a perspective view illustrating an aspect in which an upper lid 11 and a sleeve member 12 are removed from a packing structure 1C according to the fourth embodiment of the present invention;

FIG. 15 is a perspective view illustrating an aspect of lifting a substrate storing container 2 by a lifting device 4 that lifts the substrate storing container 2 from the packing structure 1C according to the fourth embodiment of the present invention;

FIG. 16 is a schematic view illustrating a first device positioning portion 14 of a lower lid 13 of a packing structure 1 according to the fifth embodiment of the present invention;

FIG. 17 is a schematic view illustrating a first device positioning portion 14E and a second device positioning portion 16A of a lower lid 13 of a packing structure 1 according to the sixth embodiment of the present invention; and FIG. 18 is a schematic view illustrating a first device positioning portion 14F of a lower lid 13 of a packing structure 1 according to the seventh embodiment of the present invention.

PREFERRED MODE FOR CARRYING OUT THE INVENTION

Figure 1:
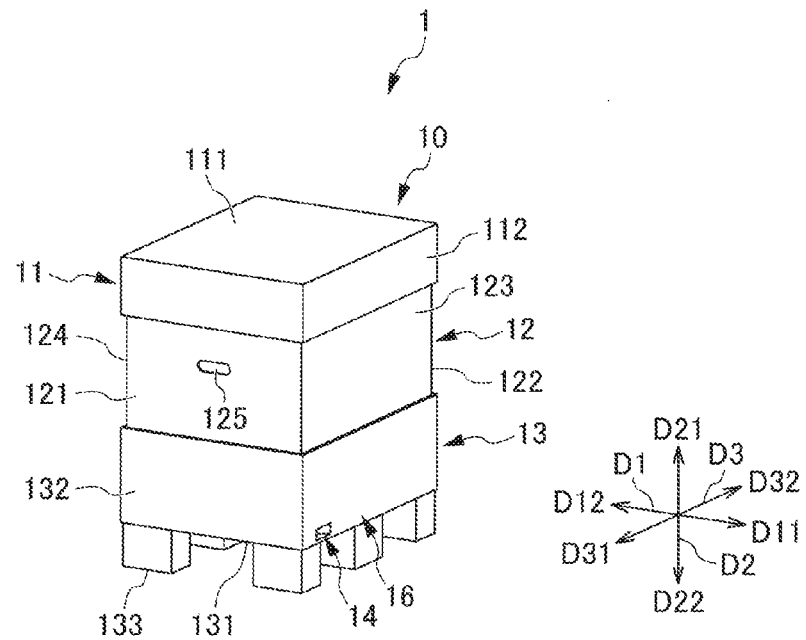
FIG. 1 is a perspective view illustrating a packing structure 1 according to the first embodiment of the present invention.
Figure 2:
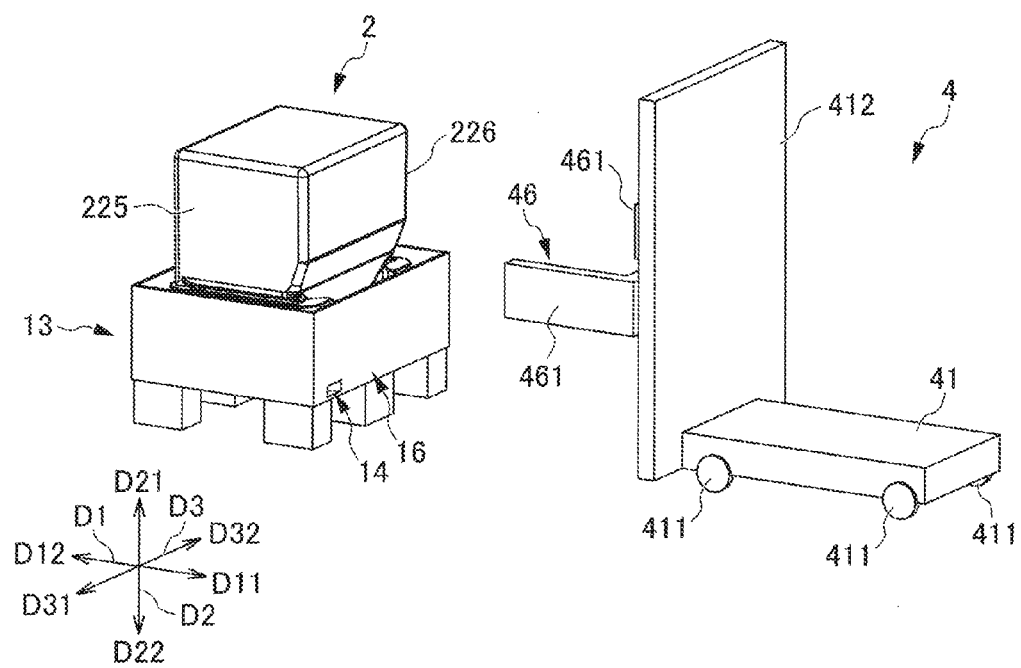
FIG. 2 is a perspective view illustrating an aspect in which an upper lid 11 and a sleeve member 12 are removed from the packing structure 1 according to the first embodiment of the present invention.
Figure 3:
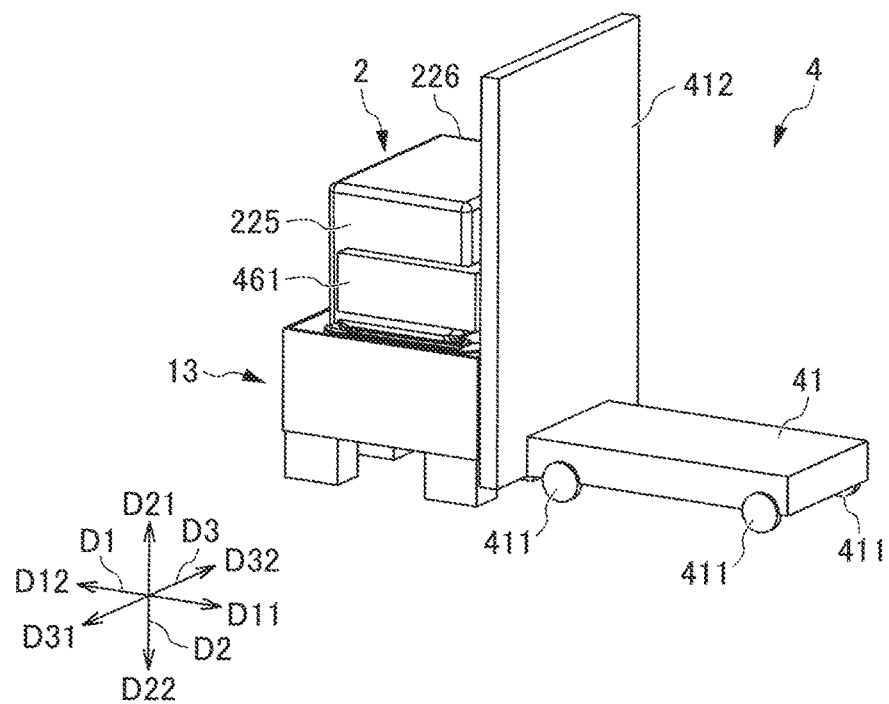
FIG. 3 is a perspective view illustrating an aspect of lifting a substrate storing container 2 by a lifting device 4 that lifts the substrate storing container 2 from the packing structure 1 according to the first embodiment of the present invention.

In the following, a packing structure 1 for packing a substrate storing container 2 according to a first embodiment of the present invention will be described with reference to the drawings. FIG. 1 is a perspective view illustrating a packing structure 1 according to the first embodiment of the present invention. FIG. 2 is a perspective view illustrating an aspect in which an upper lid 11 and a sleeve member 12 are removed from the packing structure 1 according to the first embodiment of the present invention. FIG. 3 is a perspective view illustrating an aspect of lifting a substrate storing container 2 by a lifting device 4 that lifts the substrate storing container 2 from the packing structure 1 according to the first embodiment of the present invention. FIG. 4 is a schematic view illustrating a first device positioning portion 14 and a second device positioning portion 16 of a lower lid 13 of the packing structure 1 according to the first embodiment of the present invention. FIG. 5 is an exploded perspective view illustrating the substrate storing container packed by the packing structure 1 according to the first embodiment of the present invention. FIG. 6 is a perspective view illustrating a substrate storing container storing bag 3 which stores the substrate storing container 2 packed by the packing structure 1 according to the first embodiment of the present invention.

Herein, for convenience of explanation, the direction from a back plate 124 toward a front plate 123 of a packing box 10 (described later) (lower left direction in FIG. 1) is defined as a forward direction D11, and the opposite direction to the direction D11 is defined as a backward direction D12. Furthermore, these directions are defined as a forward/backward direction D1. Furthermore, the direction from a bottom plate 131 toward a top plate 111 (described later) (upper direction in FIG. 1) is defined as an upper direction D21, and the direction opposite to the direction D21 is defined as a lower direction D22. In addition, these directions are defined as an upper/lower direction D2. Furthermore, the direction from a second side plate 122 toward a first side plate 121 (described later) (upper left direction in FIG. 1) is defined as a left direction D31, and the direction opposite to the direction D31 is defined as a right direction D32. Furthermore, these directions are defined as a left/right direction D3.

As illustrated in FIG. 5, the substrate storing container packed by the packing structure 1 stores and transports substrates W composed of semiconductor wafers, and includes a container main body 202 and a lid body 203.

The container main body 202 has a tubular wall portion 220 with a container main body opening portion 221 formed at one end and the other end closed. A substrate storing space 227 is formed in the container main body 202. The substrate storing space 227 is formed to be surrounded by the wall portion 220. A substrate support plate-like portion 205 and a rear retainer (not illustrated) are arranged at a part that is a part of the wall portion 220 and forming the substrate storing space 227. A plurality of substrates W can be stored in the substrate storing container 227.

The substrate support plate-like portion 205 is provided at the wall portion 220 so as to form a pair in the substrate storing space 227 in the left/right direction D3. When the container main body opening portion 221 is not closed by the lid body 203, the substrate support plate-like portion 205 can support edge portions of the plurality of substrates W in a state in which adjacent substrates W are arranged in parallel to be spaced apart by a predetermined interval. The rear retainer (not illustrated) can support rear portions of the edge portions of the plurality of substrates W when the container main body opening portion 221 is closed by the lid body 203.

The lid body 203 can be removably attached to the container main body opening portion 221, and can close the container main body opening portion 221. A front retainer (not illustrated) is provided at the lid body 203. The front retainer (not illustrated) is a part of the lid body 203 and provided at a part facing a portion which faces the substrate storing space 227 when the container main body opening portion 221 is closed by the lid body 203. The front retainer (not illustrated) is arranged so as to form a pair with the rear retainer (not illustrated).

The front retainer (not illustrated) can support front portions of the edge portions of the plurality of substrates W when the container main body opening portion 221 is closed by the lid body 203. The front retainer (not illustrated) retains the plurality of substrates W in a state in which adjacent substrates W are arranged in parallel to be spaced apart by a predetermined interval, by supporting the plurality of substrates W in cooperation with the rear retainer (not illustrated) when the container main body opening portion 221 is closed by the lid body 203.

The substrates W (refer to FIG. 5) stored in the substrate storing container 2 are disk-like silicon wafers, glass wafers, sapphire wafers, etc., and are thin members used for industrial use. The substrates W according to the present embodiment are silicon wafers having a diameter of 300 mm to 450 mm. The substrate storing container 2 storing such substrates W is, as illustrated in FIG. 6 in its entirety, stored in a sealed state by an opaque substrate storing container storing bag 3. Then, the substrate storing container 2 is packed by a packing box 10 in this state. It should be noted that, in FIGS. 2, 3, 8, 9, 11, 12, 14 and 15, for facilitating understanding of an aspect in which the substrate storing container 2 is sandwiched by the lifting device 4, illustration of the substrate storing container storing bag 3 is omitted.

As illustrated in FIG. 1, the packing structure 1 for packing the substrate storing container 2 includes a packing box 10, an upper cushioning material (not illustrated), a lower cushioning material (not illustrated), a rigid body (not illustrated), and a coil spring (not illustrated) serving as an elastic support member. The packing structure 1 packs the substrate storing container 2 for storing and transporting the substrates W composed of semiconductor wafers.

As illustrated in FIG. 1, the packing box 10 includes an upper lid 11, a sleeve member 12, and a lower lid 13 composed of a so-called plastic card board box (corrugated plastic, also known as "pladan"), respectively, and has a cuboid shape as a whole.

The upper lid 11 has the top plate 111 and an upper lid peripheral wall 112. The top plate 111 has a rectangular shape. The upper lid peripheral wall 112 has four pieces in a rectangular plate-like shape that extend from the periphery of the top plate 111 in the lower direction D22, with one end thereof being closed by the top plate 111 and the other end being open, and has a square cylinder shape.

The sleeve member 12 is configured with the first side plate 121, the second side plate 122, the front plate 123, and the back plate 124 having a rectangular shape, respectively, has an axial center extending in the upper/lower direction, and has a square cylinder shape with both ends open. Through-holes 125 in an oval shape which are made long in the forward/backward direction are formed at the first side plate 121 and the second side plate 122 of the sleeve member 12, respectively. An operator can pick up the sleeve member 12 by inserting a hand into the through-hole 125.

The lower lid 13 has the bottom plate 131, a lower lid peripheral wall 132, and lower lid leg portions 133. The bottom plate 131 has a rectangular shape. The lower lid peripheral wall 132 has four pieces in a rectangular plate-like shape that extend upwards from the periphery of the bottom plate 131, with one end thereof being closed by the bottom plate 131 and the other end being open, and has a square cylinder shape. The lower lid leg portions 133 are provided at the four corners of the bottom plate 131, and at the center of the end edge in the forward direction D11 of the left/right direction D3 and at the center of the end edge in the backward direction D12 of the left/right direction D3. The total number of the lower lid leg portions 133 is six and all thereof extend in the lower direction D22.

With a positional relationship in which the periphery of the upper end of the sleeve member 12 is surrounded by the upper lid peripheral wall 112, the top plate 111 of the upper lid 11 is placed at the upper end of the sleeve member 12. Furthermore, with a positional relationship in which the periphery of the lower end of the sleeve member 12 is surrounded by the lower lid peripheral wall 132, the lower end of the sleeve member 12 is placed on the bottom plate 131 of the lower lid 13. With such a configuration, the packing box 10 configured from the upper lid 11, the sleeve member 12, and the lower lid 13 is assembled.

An upper cushioning material (not illustrated) made of styrene foam, the substrate storing container 2, and a lower cushioning material (not illustrated) made of styrene foam are packed in the packing box 10 configured as above. More specifically, the substrate storing container 2 is placed at the lower cushioning material (not illustrated) and the upper cushioning material is placed at the substrate storing container 2. In other words, the upper cushioning material (not illustrated), the lower cushioning material (not illustrated), and the substrate storing container 2 are placed in the packing box 10 in such a manner that the substrate storing container 2 is sandwiched by the upper cushioning material (not illustrated) and the lower cushioning material (not illustrated) in the upper/lower direction D2.

The lower cushioning material (not illustrated) supports the substrate storing container 2 so that the substrate storing container 2 always takes a constant posture with respect to the lower lid 13. In other words, the substrate storing container 2 is always placed at the lower cushioning material (not illustrated) so that a lower portion of the substrate storing container 2 is located at a side in the lower direction D22, a side wall 225 on the left side of the substrate storing container 2 is located at a side in the left direction D31, and a side wall 226 on the right side of the substrate storing container 2 is located at a side in the right direction D32.

The rigid body (not illustrated) is configured by a card board plate or a plastic plate. The rigid body (not illustrated) has a rectangular plate shape. The rigid body (not illustrated) has a flat upper face and a flat lower face. The upper face of the rigid body (not illustrated) abuts the lower face as a lower end face of the lower cushioning material (not illustrated) to support the lower cushioning material (not illustrated). Furthermore, the lower face of the rigid body (not illustrated) abuts an upper end of a coil spring (not illustrated) described later serving as an elastic support member, and is supported by the coil spring (not illustrated).

The coil springs (not illustrated) are arranged at the four corners of the rigid body (not illustrated) in the packing box 10. The coil spring (not illustrated) biases the rigid body (not illustrated) in the upper direction D21, and the upper portion of the coil spring (not illustrated) is fixed to the rigid body (not illustrated) in a state abutting the lower face of the rigid body (not illustrated). The lower end of the coil spring (not illustrated) is fixed in a state abutting the bottom plate 131 of the lower lid 13. With such a configuration, the elastically deformable coil spring (not illustrated) is supported by the bottom plate 131 of the packing box 10 and the upper end of the coil spring (not illustrated) indirectly supports the lower cushioning material (not illustrated) via the rigid body (not illustrated). In the following, the configuration of the device positioning portions 14 and 16 of the lower lid 13, and the positioned portions 43 and 45 of the lifting device 4 that lifts the substrate storing container 2 will be described in detail.

As illustrated in FIGS. 2 and 3, the lifting device 4 that lifts a substrate storing container includes a cart unit 41, a first positioned portion 43 (refer to FIG. 4) and a second positioned portion 45 (refer to FIG. 4) as positioned portions, and a container retaining portion 46. The cart unit includes four tires 411 which allow the cart unit 41 to move by being driven. It should be noted that only three tires appear in FIGS. 2 and 3. A wall portion 412 is provided at an end of the cart unit 41. The wall portion 412 has a rectangular plate portion that extends in the upper/lower direction.

The container retaining portion 46 is configured by two arms 461 that extend rearwards in parallel. The two arms 461 are engaged with a guide portion (not illustrated) provided at the wall portion 412 and can move in the upper/lower direction along the wall portion 412. Furthermore, the two arms 461 can approach each other or space apart in the left/right direction D3. With such a configuration, the lifting device 4 can lift the substrate storing container 2 in a state sandwiching the substrate storing container 2 between the two arms 461.

The first positioned portion 43 and the second positioned portion 45 are provided at the wall portion 412. More specifically, as illustrated in FIG. 4, a semispherical projecting portion 431 serving as the first positioned portion 43 having a semispherical tip portion, and a flat projecting portion 451 serving as the second positioned portion 45 having a tip configured by a flat face are provided at the lower portion of the lower wall 412.

The first device positioning portion 14 and the second device positioning portion 16 as device positioning portions exist at the lower lid peripheral wall 132 constituting the packing box 10. As illustrated in FIG. 4, the first device positioning portion 14 has a triangular concave portion 141 of triangular shape in a cross section perpendicular to a direction connecting the upper lid 11 and the lower lid 13 (a cross section parallel to the forward/backward direction D1 and the left/right direction D3). Furthermore, the second device positioning portion 16 has a flat abutting face 161.

The semispherical projecting portion 431 can engage with the triangular concave portion 141. At the triangular concave portion 141, a portion at which the semispherical portion of the semispherical projecting portion 431 abuts configures an approaching-distancing direction end 144 in a approaching-distancing direction (the forward/backward direction D1), which is a direction perpendicular to the direction connecting the upper lid 11 and the lower lid 13 (the upper/lower direction D2) as well as a direction of approaching or distancing with respect to the lower lid 13. At the same time, in the triangular concave portion 141, a portion abutted by the semispherical tip portion of the semispherical projecting portion 431 configures a regulation-direction one end 142 and a regulation-direction other end 143 in a regulation direction (the left/right direction D3), which is a direction perpendicular to the direction connecting the upper lid 11 and the lower lid 13 (the upper/lower direction D2) as well as the approaching-distancing direction (the forward/backward direction D1).

Furthermore, the tip flat face of the flat projecting portion 451 can abut the abutting face 161. In the abutting face 161, a portion abutted by the tip flat face of the flat projecting portion 451 configures an approaching-distancing direction end 164 in the approaching/distancing direction (the forward/backward direction D1), which is a direction perpendicular to the direction connecting the upper lid 11 and the lower lid 13 (the upper/lower direction D2) as well as a direction approaching or distancing with respect to the lower lid 13.

Therefore, the first positioned portion 43 of the lifting device 4 includes an approaching-distancing direction end abutting portion 434 which can abut the approaching-distancing direction end 144 of the triangular concave portion 141 in the approaching-distancing direction (the forward/backward direction D1), and one end abutting portion 432 and the other end abutting portion 433 which can abut the regulation-direction one end 142 and the regulation-direction other end 143, respectively, in the regulation direction (the left/right direction D3). By the engagement of the semispherical projecting portion 431 with the triangular concave portion 141 and the abutting of the tip flat face of the flat projecting portion 451 with the abutting face 161, the first device positioning portion 14 and the second device positioning portion 16 can engage with the first positioned portion 43 and the second positioned portion 45 of the lifting device 4 that lift the substrate storing container 2.

The operations upon lifting the substrate storing container 2 packed by the packing structure as described above by the lifting device 4 are as follows. Initially, the upper lid 11 (refer to FIG. 1) and the sleeve member 12 (refer to FIG. 1) are removed from the lower lid 13 in the packing box 10 illustrated in FIG. 1 to establish the state illustrated in FIG. 2. Next, as illustrated in FIGS. 2 and 4, the lifting device 4 is set in a positional relationship in which the first positioned portion 43 and the second positioned portion 45 face the first device positioning device 14 and the second device positioning portion 16, respectively, and the lifting device 4 is made to move in the backward direction D12.

Then, the approaching-distancing direction end abutting portion 454 of the flat projecting portion 451 of the second positioned portion 45 is made to abut the flat abutting face 161 of the second device positioning portion 16. At the same time, the approaching-distancing direction end abutting portion 434 of the semispherical projecting portion 431 is made to abut the approaching-distancing direction end 144 of the triangular concave portion 141, and furthermore, the one end abutting portion 432 and the other end abutting portion 433 are made to abut the regulation-direction one end 142 and the regulation-direction other end 143 of the triangular concave portion 141, respectively.

With such a configuration, the positioning of the lifting device 4 with respect to the lower lid 13 in the approaching-distancing direction (the forward/backward direction D1) is carried out, and at the same time, the positioning of the lifting device 4 with respect to the lower lid 13 in the regulation direction (the left/right direction D3) is carried out. In such a state, as illustrated in FIG. 3, the two arms 461 of the lifting device 4 abut the side wall 225 on the left side and the side wall 226 on the right side of the substrate storing container 2, respectively, supported by the lower lid 13 of the packing box 10 in a state of the upper lid 11 and the sleeve member 12 being removed therefrom so as to lift the substrate storing container 2. In such a state, the cart unit drives the four tires 411 to move, and transports the substrate storing container 2 to a predetermined location.

With such a packing structure 1 according to the first embodiment of the abovementioned configuration, the following effects can be obtained. The packing structure 1 for packing the substrate storing container 2 for storing and transporting the substrates W composed of semiconductor wafers includes the packing box 10 having the lower lid 13, the sleeve member 12, and the upper lid 11. The lower lid 13 includes the bottom plate 131 that supports the substrate storing container 2 and the lower lid peripheral wall 132 that extends upwards from the periphery of the bottom plate 131. The sleeve member 12 has a tubular shape having an axial center that extends in the upper/lower direction. The upper lid 11 includes the upper lid peripheral wall 112 that extends downwards from the top plate 111 and the periphery of the top plate 111. The lower end of the sleeve member 12 is placed on the bottom plate 131 of the lower lid 13 and the top plate 111 of the upper lid 11 is placed at the upper end of the sleeve member 12. The lower lid includes the device positioning portions 14 and 16. The device positioning portions 14 and 16 can engage with the positioned portions 43 and 45 of the lifting device 4 that lifts from the lower lid 13 the substrate storing container 2, which is supported by the lower lid 13 of the packing box 10 in a state of the upper lid 11 and the sleeve member 12 being removed therefrom.

With such a configuration, it is possible to position the lifting device 4 with respect to the packing box 10 precisely and reliably. For this reason, it is possible to position the lifting device 4 precisely and reliably with respect to the substrate storing container 2 in a predetermined posture by packing the substrate storing container 2 so as to be in a predetermined posture with respect to the packing box 10.

Furthermore, the device positioning portions 14 and 16 have the approaching-distancing direction end 144 in the approaching-distancing direction (the forward/backward direction D1), which is a direction perpendicular to the direction connecting the upper lid 11 and the lower lid 13 (the upper/lower direction D2), as well as a direction approaching or distancing with respect to the lower lid 13 and the regulation-direction one end 142 and the regulation-direction other end 143 in a regulation direction (the left/right direction D3) which is perpendicular to the direction connecting the upper lid 11 and the lower lid 13 as well as the approaching-distancing direction. Furthermore, the positioned portions 43 and 45 include the approaching-distancing direction end abutting portion 434 which can abut the approaching-distancing direction end 144 in the approaching-distancing direction, and one end abutting portion 432 and the other end abutting portion 433, which can abut the regulation-direction one end 142 and the regulation-direction the other end 143, respectively, in the regulation direction.

With such a configuration, it is possible to position the lifting device 4 precisely and reliably with respect to the packing box 10 in the approaching-distancing direction (the forward/backward direction D1), which is a direction perpendicular to a direction connecting the upper lid 11 with the lower lid 13, as well as a direction approaching or distancing with the lower lid 13 and in the regulation direction (the left/right direction D3), which is a direction perpendicular to the direction connecting the upper lid 11 with the lower lid 13 as well as the approaching-distancing direction.

Furthermore, the device positioning portion includes at least one first device positioning portion 14 having the approaching-distancing direction end 144, the regulation-direction one end 142, and the regulation-direction other end 143, and at least one second device positioning portion 16 having a shape different from that of the first device positioning portion 14 and having the approaching-distancing direction end 164. The positioned portion includes the first positioned portion 43 having the approaching-distancing direction end abutting portion 434, the one end abutting portion 432 and the other end abutting portion 433, and the second positioned portion 45 having the approaching-distancing direction end abutting portion 454.

With such a configuration, by configuring the first device positioning portion 14 and the second device positioning portion 16 differently, and by configuring the first positioned portion 43 and the second positioned portion 45 differently, it is possible to avoid an incorrect operation and to position the lifting device 4 correctly.

Furthermore, the device positioning portions 14 and 16 exist at the lower lid peripheral wall 132. With such a configuration, it is possible to maintain the function of positioning the lifting device 4 even in a state of the upper lid 11 and the sleeve member 12 being removed.

Furthermore, the lower cushioning member (not illustrated) is provided on which the substrate storing container 2 is placed in the packing box 10. With such a configuration, it is possible to absorb vibration or impact transmitted from the lower lid 13, etc. to the substrate storing container 2 with the lower cushioning material.

Furthermore, a coil spring (not illustrated) serving as an elastic support member is provided which is disposed in the packing box 10, is elastically deformable, is supported by the bottom plate 131 of the packing box 10, and supports the lower cushioning member (not illustrated). With such a configuration, it is possible to effectively absorb vibration or impact transmitted from the lower lid 13, etc. to the substrate storing container 2 with the coil spring (not illustrated) serving as an elastic support member.

Furthermore, the substrate storing container 2 is supported by the lower lid 13 in a state in which the entire substrate storing container 2 is covered and stored by the substrate storing container storing bag 3, which serves as a container storing bag. As described above, even when the entire substrate storing container 2 is covered by the substrate storing container storing bag 3, it is still possible to position the lifting device 4 reliably with respect to the substrate storing container 2 having a predetermined posture.

Next, a packing structure 1A for packing a substrate storing container 2 according to the second embodiment of the present invention will be described. FIG. 7 is a perspective view illustrating the packing structure 1A according to the second embodiment of the present invention. FIG. 8 is a perspective view illustrating an aspect in which an upper lid and a sleeve member 12 are removed from the packing structure 1A according to the second embodiment of the present invention. FIG. 9 is a perspective view illustrating an aspect of lifting a substrate storing container 2 by a lifting device that lifts the substrate storing container 2 from the packing structure 1A according to the second embodiment of the present invention. FIG. 10 is a schematic view illustrating a first device positioning portion 14 and a second device positioning portion 16 of a lower lid 13 of the packing structure 1A according to the second embodiment of the present invention.

The second embodiment differs from the first embodiment in the point that the configurations of a second device positioning portion 16A and a second positioned portion 45A differ from the configurations of the second device positioning portion 16 and the second positioned portion 45 in the first embodiment. Regarding configurations other than this, since the second embodiment is the same as the first embodiment, the same members are illustrated with the same reference numerals, and the descriptions thereof will be omitted.

As illustrated in FIG. 10, the second device positioning portion 16A has a rectangular concave portion 161A in place of the flat abutting face 161 (refer to FIG. 4). The rectangular concave portion 161A is formed to be indented in the backward direction D12 and has a rectangular shape in a cross section perpendicular to a direction connecting the upper lid 11 with the lower lid 13 (a cross section parallel to the forward/backward direction D1 and the left/right direction D3). The second positioned portion 45A has a rectangular convex portion 451A. The rectangular convex portion 451A has a shorter rectangular shape than the length of the rectangular concave portion 161A in the left/right direction in a plan view, and projects in the backward direction D12.

Operations upon lifting the substrate storing container 2 packed by the packing structure 1A as described above by the lifting device 4 are as follows. Initially, the upper lid 11 and the sleeve member 12 are removed from the lower lid 13 in the packing box 10 illustrated in FIG. 7 to establish the state illustrated in FIG. 8. Next, as illustrated in FIGS. 8 and 10, the lifting device 4 is set in a positional relationship in which the first positioned portion 43 and the second positioned portion 45A face the first device positioning device 14 and the second device positioning portion 16A, respectively, and the lifting device 4 is made to move in the backward direction D12.

Then, the rectangular convex portion 451A of the second positioned portion 45A is made be engage with the rectangular concave portion 161A of the second device positioning portion 16A. With such a configuration, an approaching-distancing direction end abutting portion 454A, which is configured by an end face of the rectangular convex portion 451A in the backward direction D12, abuts an approaching-distancing direction end 164A, which is configured by an end face of the rectangular concave portion 161A in the backward direction D12. At the same time, an approaching-distancing direction end abutting portion 434 of a semispherical projecting portion 431 of the first positioned portion 43 abuts an approaching-distancing direction end 144 of a triangular concave portion 141 of the first device positioning portion 14, and one end abutting portion 432 and the other end abutting portion 433 of the semispherical projecting portion 431 of the first positioned portion 43 abut a regulation-direction one end 142 and a regulation-direction other end 143 of the triangular concave portion 141 of the first device positioning portion 14, respectively.

With such a configuration, positioning of the lifting device 4 with respect to the lower lid 13 in the approaching-distancing direction (the forward/backward direction D1) is carried out, and at the same time, positioning of the lifting device 4 with respect to the lower lid 13 in the regulation direction (the left/right direction D3) is carried out. In such a state, two arms 461 of the lifting device 4 abut a side wall 225 on the left side and a side wall 226 on the right side of the substrate storing container 2 to lift the substrate storing container 2 and transport the substrate storing container 2 to a predetermined location.

Next, a packing structure 1A for packing a substrate storing container 2 according to the third embodiment of the present invention will be described. FIG. 11 is a perspective view illustrating an aspect of removing an upper lid 11 from a packing structure 1 according to the third embodiment of the present invention. FIG. 12 is a perspective view illustrating an aspect of lifting a substrate storing container 2 by a lifting device 4B that lifts the substrate storing container 2 from the packing structure 1 according to the third embodiment of the present invention.

The third embodiment differs from the second embodiment in the point of the configuration of the lifting device 4B differing from the configuration of the lifting device 4 of the second embodiment. Regarding configurations other than this, since the third embodiment is the same as the second embodiment, the same members are illustrated with the same reference numerals, and the descriptions thereof will be omitted.

As illustrated in FIGS. 11 and 12, an arm support portion 413B is provided at a wall portion 412B in the lifting device 4B that lifts the substrate storing container 2. The arm support portion 413B engages with a guide portion (not illustrated) provided at the wall portion 412B, and can move in the upper/lower direction along the wall portion 412B. The two arms 461B extend in parallel downwardly from the arm support portion 413B and can approach each other or distance. It should be noted that FIGS. 11 and 12 appears only one arm 461B.

Operations upon lifting the substrate storing container 2 packed by the packing structure as described above by the lifting device 4B are as follows. Initially, the upper lid 11 is removed from the lower lid 13 and the sleeve member 12 in the packing box 10 to establish the state illustrated in FIG. 11. Next, the first positioned portion 43 (refer to FIG. 10) and the second positioned portion 45A are engaged with the first device positioning portion 14 and the second device positioning portion 16A of the lifting device 4B, respectively, to position the lifting device 4B with respect to the lower lid 13.

Next, as illustrated in FIG. 12, the two arms 461B are made to lower in the lower direction D22 from above the substrate storing container 2 supported by the lower lid 13 of the packing box 10 in a state of the upper lid 11 being removed, and then inserted between the sleeve member 12 and the substrate storing container 2. Then, the two arms 461B of the lifting device 4B abut the side wall 225 on the left side and the side wall 226 on the right side of the substrate storing container 2 to lift the substrate storing container 2 and transport the substrate storing container 2 to a predetermined location.

Next, a packing structure 1C for packing a substrate storing container 2 according to the fourth embodiment of the present invention will be described. FIG. 13 is a perspective view illustrating a packing structure 1C according to the fourth embodiment of the present invention. FIG. 14 is a perspective view illustrating an aspect in which an upper lid 11 and a sleeve member 12 are removed from a packing structure 1C according to the fourth embodiment of the present invention. FIG. 15 is a perspective view illustrating an aspect of lifting a substrate storing container 2 by a lifting device 4 that lifts the substrate storing container 2 from the packing structure 1C according to the fourth embodiment of the present invention.

The fourth embodiment differs from the second embodiment in the point of the positions of the first device positioning portion 14 and the second device positioning portion 16A differing from the positions of the first device positioning portion 14 and the second device positioning portion 16A of the second embodiment and, along with these differences, the position of the first positioned portion 43 and the second positioned portion 45A differing from the position of the first positioned portion 43 and the second positioned portion 45A of the second embodiment. Regarding configurations other than this, since the fourth embodiment is the same as the second embodiment, the same members are illustrated with the same reference numerals, and the descriptions thereof will be omitted.

As illustrated in FIG. 13, the first device positioning portion 14 exists at an end face of a side in the forward direction D11 of the lower lid leg portion 133C provided at an end edge in the forward direction D11 and an end edge in the left direction D31 of the bottom plate 131. Furthermore, the second device positioning portion 16A exists at an end face of a side in the forward direction D11 of the lower lid leg portion 133C provided at an end edge in the forward direction D11 and at the center in the left/right direction D3 of the bottom plate 131. Along with this configuration, the first positioned portion (not illustrated) and the second positioned portion (not illustrated), which are shapes respectively identical to those of the first positioned portion 43 and the second positioned portion 45A of the second embodiment, exist at positions facing the first device positioning portion 14 and the second device positioning portion 16A on the lifting device 4.

As described above, the first device positioning portion 14 and the second device positioning portion 16A exist at the lower lid leg portion 133C. With such a configuration, a space for providing an indent of a positioning portion at the lower lid 13 does not exist inside the lower lid 13, and thus it is possible to provide a positioning portion even when it is difficult to provide a positioning portion at the lower lid 13.

Next, a packing structure for packing a substrate storing container 2 according to the fifth embodiment of the present invention will be described. FIG. 16 is a schematic view illustrating a first device positioning portion 14 of a lower lid 13 of a packing structure 1 according to the fifth embodiment of the present invention.

The fifth embodiment differs from the first embodiment in the point of the fifth embodiment having three first device positioning portions 14 of identical shape and not having a second device positioning portion 16, and along with this configuration, the fifth embodiment having three first positioned portions 43 of identical shape and not having a second device positioned portion 45. Regarding configurations other than this, since the fifth embodiment is the same as the first embodiment, the same members are illustrated with the same reference numerals, and the descriptions thereof will be omitted.

As illustrated in FIG. 16, the first device positioning portion 14 includes a first triangular concave portion 141-1, a second triangular concave portion 141-2, and a third triangular concave portion 141-3. The first triangular concave portion 141-1, the second triangular concave portion 141-2, and the third triangular concave portion 141-3 have the same shape as the triangular concave portion 141 constituting the first device positioning portion 14 of the first embodiment. Therefore, similarly to the first device positioning portion of the first embodiment, the first triangular concave portion 141-1, the second triangular concave portion 141-2, and the third triangular concave portion 141-3 have approaching-distancing direction ends 144-1, 144-2, 144-3, regulation-direction one ends 142-1, 142-2, 142-3, and regulation-direction other ends 143-1, 143-2, 143-3, respectively, which are identical to the approaching-distancing direction end 144, the regulation-direction one end 142, the regulation-direction other end 143, respectively.

As illustrated in FIG. 16, the triangular concave portion 141-1, the second triangular concave portion 141-2, and the third triangular concave portion 141-3 that are adjacent are arranged so as to be spaced apart at different intervals. In other words, the interval between the first triangular concave portion 141-1 and the second triangular concave portion 141-2 is smaller than the interval between the second triangular concave portion 141-2 and the third triangular concave portion 141-3.

Furthermore, as illustrated in FIG. 16, the first positioned portion 43 includes a first semispherical projecting portion 431-1, a second semispherical projecting portion 431-2, and a third semispherical projecting portion 431-3. The first semispherical projecting portion 431-1, the second semispherical projecting portion 431-2, and the third semispherical projecting portion 431-3 have an identical shape to the semispherical projecting portion 431 constituting the first positioned portion 43 of the first embodiment. For this reason, similarly to the first positioned portion 43 of the first embodiment, the first semispherical projecting portion 431-1, the second semispherical projecting portion 431-2, and the third semispherical projecting portion 431-3 have approaching-distancing direction end abutting portions 434-1, 434-2, 434-3, one end abutting portions 432-1, 432-2, 432-3, and the other end abutting portions 433-1, 433-2, 433-3, respectively, which are identical to the approaching-distancing direction end abutting portion 434, the one end abutting portion 432, the other end abutting portion 433, respectively.

The first semispherical projecting portion 431-1, the second semispherical projecting portion 431-2, and the third semispherical projecting portion 431-3 that are adjacent are arranged so as to be spaced apart at different intervals. In other words, the interval between the first semispherical projecting portion 431-1 and the second semispherical projecting portion 431-2 is smaller than the interval between the second semispherical projecting portion 431-2 and the third semispherical projecting portion 431-3.

According to the packing structure according to the fifth embodiment of the abovementioned configuration, the following effects can be obtained. The three first device positioning portions 14 have the first triangular concave portion 141-1, the second triangular concave portion 141-2, and the third triangular concave portion 141-3 as the three first device positioning portions 14 of identical shape having the approaching-distancing direction end portions 144-1, 144-2, 144-3, the regulation-direction one ends 142-1, 142-2, 142-3, and the regulation-direction the other ends 143-1, 143-2, 143-3. The first triangular concave portion 141-1 to the third triangular concave portion 141-3 as the first device positioning portions 14 that are adjacent are arranged so as to be spaced apart at different intervals.

Furthermore, the three first positioned portions 43 have the approaching-distancing direction end abutting portions 434-1, 434-2, 434-3, one end abutting portions 432-1, 432-2, 432-3, and the other end abutting portions 433-1, 433-2, 433-3, respectively, and include the first semispherical projecting portion 431-1, the second semispherical projecting portion 431-2, and the third semispherical projecting portion 431-3 as the first positioned portions 43 that can abut the first triangular concave portion 141-1, the second triangular concave portion 141-2, and the third triangular concave portion 141-3 as the first device positioning portion 14 one by one, respectively.

With such a configuration, the first triangular concave portion 141-1, the second triangular concave portion 141-2, and the third triangular concave portion 141-3 can engage with the first semispherical projecting portion 431-1, the second semispherical projecting portion 431-2, and the third semispherical projecting portion 431-3, respectively, and thus it is possible to position the lifting device 4 with higher precision with respect to the lower lid 13.

Next, a packing structure for packing a substrate storing container 2 according to the sixth embodiment of the present invention will be described. FIG. 17 is a schematic view illustrating a first device positioning portion 14E and a second device positioning portion 16A of a lower lid 13 of a packing structure 1 according to the sixth embodiment of the present invention.

The sixth embodiment differs from the second embodiment in the point of one first device positioning portion 14E and two second device positioning portions 16A being included in a device positioning portion and, along with this configuration, one first positioned portion 43 and two second positioned portions 45A being included in a positioned portion. Regarding configurations other than this, since the sixth embodiment is the same as the second embodiment, the same members are illustrated with the same reference numerals, and the descriptions thereof will be omitted.

As illustrated in FIG. 17, the first device positioning portion 14E includes a tapered portion 141E in which the width in the left/right direction D3 becomes smaller as moving to the backward direction D12 in a cross section perpendicular to a direction connecting the upper lid 11 with the lower lid 13 (a cross section parallel to the forward/backward direction D1 and the left/right direction D3), and also a rectangular rear portion 145E having a rectangular shape in the backward direction D12. The second device positioning portions 16A exist on both sides of the first device positioning portion 14E in the left/right direction D3 to be spaced apart from the first device positioning portion 14E. The second device positioning portions 16A includes rectangular concave portions 161A which have an identical shape to the rectangular concave portion 161A constituting the second device positioning portion 16A of the second embodiment.

The first positioned portion 43 includes a semispherical projecting portion 431 which has an identical shape to the semispherical projecting portion 431 of the second embodiment. Furthermore, a second positioned portion 45A includes a rectangular convex portion 451A which has an identical shape to the rectangular convex portion 451A of the second embodiment. Therefore, in the tapered portion 141E, a portion at which a semispherical portion of the semispherical projecting portion 431 abuts an approaching-distancing direction end 144E in an approaching-distancing direction (the forward/backward direction D1), which is a direction perpendicular to a direction connecting the upper lid 11 with the lower lid 13 (the upper/lower direction D2), as well as a direction approaching or distancing with respect to the lower lid 13. At the same time, in the tapered portion 141E, a portion at which a semispherical tip portion of the semispherical projecting portion 431 constitutes a regulation-direction one end 142E and a regulation-direction other end 143E in a regulation direction (the left/right direction D3) which is a direction connecting the upper lid 11 with the lower lid 13 (the upper/lower direction D2) as well as a direction perpendicular to an approaching-distancing direction (forward/backward direction D1). The first device positioning portion 14E can engage with the first positioned portion 43. The second device positioning portion 16A can engage with the second positioned portion 45A. With these engagements, it is possible to position the lifting device 4 with respect to the lower lid 13.

Next, a packing structure 1F for packing a substrate storing container 2 according to the seventh embodiment of the present invention will be described. FIG. 18 is a schematic view illustrating a first device positioning portion 14F of a lower lid 13 of a packing structure 1 according to the seventh embodiment of the present invention.

The seventh embodiment differs from the other embodiments in the point of a first positioned portion 43F and a second positioned portion 45F engaging with one first device positioning portion 14F.

As illustrated in FIG. 18, the first device positioning portion 14F serving as a common device positioning portion has a horizontally long concave portion 141F in the left/right direction. An end of the horizontally long concave portion 141F in the left direction D31 has a pointed-shape portion 146F which is pointed so as to make an acute angle in the left direction D31. The end of the horizontally long concave portion 141F in the right direction D32 has a forward/backward extending portion 147F that extends in parallel to the forward/backward direction D1. The end of the horizontally long concave portion 141F in the backward direction D12 has a left/right extending portion 148F that extends in parallel in the left/right direction.

As illustrated in FIG. 18, the first positioned portion 43F has a backward extending portion 435F that extends in the backward direction and a left direction semispherical projecting portion 436F that projects in a semispherical shape in the left direction D31 from a back end of the backward extending portion 435F. The second positioned portion 45F extends in the backward direction D12 and has an oval tip portion projecting portion 455F of which the tip portion is sharper than that of the semispherical projecting portion 431 of the first embodiment.

A left direction semispherical projecting portion 436F can engage with the pointed-shape portion 146F. In the left direction semispherical projecting portion 436F, a portion abutted by a semispherical tip portion of the left direction semispherical projecting portion 436F constitutes a regulation-direction one end 142F in a regulation direction (the left/right direction D3), which is a direction connecting the upper lid 11 with the lower lid 13 (the upper/lower direction D2) as well as a direction perpendicular to an approaching-distancing direction (the forward/backward direction D1). A back end of the backward extending portion 435F can abut the left/right extending portion 148F. In the left/right extending portion 148F, a portion abutted by the backward extending portion 435F constitutes an approaching-distancing direction end 144F in an approaching-distancing direction (the forward/backward direction D1), which is a direction perpendicular to a direction connecting the upper lid 11 with the lower lid 13 (the upper/lower direction D2) as well as a direction approaching or distancing with respect to the lower lid 13 (the forward/backward direction D1).

Furthermore, in the left/right extending portion 148F, a portion abutted by the oval tip portion projecting portion 455F includes an approaching-distancing direction end 149F that constitutes an end in an approaching-distancing direction (the forward/backward direction D1), which is a direction perpendicular to a direction connecting the upper lid 11 with the lower lid 13 (the upper/lower direction D2) as well as a direction approaching or distancing with respect to the lower lid 13. A side face at a right end of the oval tip portion projecting portion 455F can abut the forward/backward extending portion 147F. In the forward/backward extending portion 147F, a portion abutted by the side face of the right end of the oval tip portion projecting portion 455F constitutes a regulation-direction other end 143F in a regulation direction (the left/right direction D3), which is a direction connecting the upper lid 11 with the lower lid 13 (the upper/lower direction D2) as well as a direction perpendicular to an approaching-distancing direction (the forward/backward direction D1).

Therefore, the left direction semispherical projecting portion 436F of the first positioned portion 43F of the lifting device 4 can abut the regulation-direction one end 142F in the regulation direction (the left/right direction D3), and includes one end abutting portion 432F which constitutes one end in the regulation direction (the left/right direction D3). The backward extending portion 435F of the first positioned portion 43F of the lifting device 4 includes an approaching-distancing direction end abutting portion 434F that can abut the approaching-distancing direction end 144F in the approaching-distancing direction (the forward/backward direction D1). Furthermore, a back end of the oval tip portion projecting portion 455F of the lifting device 4 includes an approaching-distancing direction end abutting portion 437F that can abut the approaching-distancing direction end 149F in the approaching-distancing direction (the forward/backward direction D1). The oval tip portion projecting portion 455F of the second positioned portion 45F of the lifting device 4 can abut the regulation-direction other end 143F in the regulation direction (the left/right direction D3), and includes the other end abutting portion 433F which constitutes the other end in the regulation direction (the left/right direction D3).

The distance from the regulation-direction one end 142F to the regulation direction other end 143F in the left/right direction D3 is the same as the distance from the one end abutting portion 432F to the other end abutting portion 433F in the left/right direction D3. By means of the engagement of the left direction semispherical projecting portion 436F to the pointed-shape portion 146F, the abutting of the backward extending portion 435F with the left/right extending portion 148F, and the abutting of the side face of the right end of the oval tip portion projecting portion 455F with the forward/backward extending portion 147F, the first device positioning portion 14F can engage with the first positioned portion 43F and the second positioned portion 45F of the lifting device 4 that lifts the substrate storing container 2.

Operations upon engaging the first positioned portion 43F and the second positioned portion 45F as described above with the first device positioning portion 14F are as follows. Initially, as illustrated in FIG. 18, the first positioned portion 43F and the second positioned portion 45F are arranged so as to establish a positional relationship facing the first device positioning portion 14F. Next, the left direction semispherical projecting portion 436F is made to engage with the pointed-shape portion 146F. At this time, the oval tip portion projecting portion 455F has not yet been inserted into the horizontally long concave portion 141F. Next, in a state of the left direction semispherical projecting portion 436F being engaged with the pointed shape portion 146F, the oval tip portion projecting portion 455F is inserted into the horizontally long concave portion 141F to cause the approaching-distancing direction end abutting portion 437F to abut the approaching-distancing direction end 149F. With such a configuration, the first positioned portion 43F and the second positioned portion 45F are made to engage with the first device positioning portion 14F.

As described above, the positioned portion includes the first positioned portion 43F having the approaching-distancing direction end abutting portion 434F and the one end abutting portion 432F, as well as the second positioned portion 45F having the approaching-distancing direction end abutting portion 437F and the other end abutting portion 433F. Furthermore, the device positioning portion includes a common device positioning portion which has the approaching-distancing direction ends 144F, 149F which the approaching-distancing direction end abutting portion 434F of the first positioned portion 43F and the approaching-distancing direction end abutting portion 437F of the second positioned portion 45F can abut, the regulation-direction one end 142F that the one end abutting portion 432F of the first positioned portion 43F can abut, and the regulation-direction other end 143F that the other end abutting portion 433F of the second positioned portion 45F can abut.

With such a configuration, it is possible to position the packing box 10 precisely and reliably with respect to the lower lid 13 with smaller number of the device positioning portions.

The present invention is not to be limited to the above-mentioned embodiments, and modifications thereto within the technical scope recited in the claims are possible. For example, although the elastic support member is configured by a coil spring (not illustrated), the present invention is not limited thereto. For example, it may be configured by any of an air spring, gel, sponge, rubber, polymeric foam body having elasticity, and plastic compact having elasticity. Herein, polymeric foam body having elasticity indicates that polymeric foams without elasticity such as pumice are not included.

Since the elastic support member is configured by any of an air spring, gel, sponge, rubber, polymeric foam body having elasticity, and plastic compact having elasticity, it is possible to select the material that constitutes the elastic support member appropriately according to the elasticity required.

Furthermore, the numbers and shapes of the device positioning portion (the first device positioning portion, the second device positioning portion, the common device positioning portion) and the positioned portion (the first positioned portion, the second positioned portion) are not limited to the numbers and shapes described in the embodiments of the present application. For example, although the fifth embodiment includes the three first device positioning portions of identical shape, i.e. the first triangular concave portion 141, the second triangular concave portion 141, and the third triangular concave portion 141, the present invention is not limited to three portions.

Furthermore, in place of the configurations of the embodiments, it may be configured so that the device positioning portion (the first device positioning portion, the second device positioning portion) includes a projecting member and the positioned portion (the first positioned portion, the second positioned portion) includes a concave portion with which the projecting member engages. For example, it may be configured so that the device positioning portion includes the semispherical projecting portion of the first embodiment and the first positioned portion includes the triangular concave portion of the first embodiment.

Furthermore, although the upper face of the rigid body (not illustrated) abuts the lower face serving as a lower end face of the lower cushioning material (not illustrated) to support the lower cushioning member (not illustrated) in the first embodiment, the present invention is not limited to this configuration. For example, it may be configured so that a cushioning material such as sponge is arranged between the upper face of the rigid body (not illustrated) and the lower face of the lower cushioning material (not illustrated), and the upper face of the rigid body (not illustrated) supports the lower face of the lower cushioning material (not illustrated) via the cushioning material.

Furthermore, the materials of the upper cushioning material, the lower cushioning material, and the rigid body are not limited to the respective materials described in the embodiments. For example, it may be configured so that the rigid body is composed of a plywood board or an aluminum plate (sheet metal).

Furthermore, although the packing box 10 is composed of a so-called plastic cardboard box (corrugated plastic, also known as "pladan"), the present invention is not limited thereto. For example, it may be configured so that the packing box is composed of a corrugated cardboard made of paper or an aluminum frame. Furthermore, the substrate storing container is not limited to the shapes and the dimensions of the embodiments. Similarly, the dimensions of the substrate stored in the substrate storing container are not limited to the dimensions of the embodiments.

EXPLANATION OF REFERENCE NUMERALS 1, 1A, 1C packing structure
2 substrate storing container
3 substrate storing container storing bag (container storing bag)
4 lifting device
10 packing box
11 upper lid
12 sleeve member
13 lower lid
14, 14E, 14F first device positioning portion
16, 16A second device positioning portion
43, 43F first positioned portion
45, 45A, 45F second positioned portion
111 top plate
112 upper lid peripheral wall
132 lower lid peripheral wall
133, 133C lower lid leg portion
142, 142-1, 142-2, 142-3, 142E, 142F regulation-direction one end
143, 143-1, 143-2, 143-3, 143E, 143F regulation-direction other end
144, 144-1, 144-2, 144-3, 144F, 149F, 164, 164A approaching-distancing direction end
432, 432-1, 432-2, 432-3, 432F one end abutting portion
433, 433-1, 433-2, 433-3, 433F other end abutting portion
434, 434-1, 434-2, 434-3, 434F approaching-distancing direction end abutting portion
W substrate

The invention claimed is:

1. A packing structure for packing a substrate storing container for storing and transporting substrates made of semiconductor wafers, the packing structure comprising:
a packing box including:
a lower lid having a bottom plate which supports the substrate storing container and a lower lid peripheral wall which extends upwards from a periphery of the bottom plate;
a sleeve member of tubular shape having an axial center that extends in a vertical direction; and
an upper lid having a top plate and an upper lid peripheral wall which extends downwards from a periphery of the top plate,
wherein a lower end of the sleeve member is placed on the bottom plate of the lower lid, and the top plate of the upper lid is placed at an upper end of the sleeve member,
wherein the lower lid includes a device positioning portion,
wherein the device positioning portion can engage a positioned portion of a lifting device that lifts, from the lower lid, the substrate storing container which is supported by the lower lid of the packing box in a state of the upper lid being removed therefrom, and
wherein the device positioning portion exists at the lower lid peripheral wall that faces the lifting device when the lifting device lifts the substrate storing container.

2. The packing structure according to claim 1, wherein the device positioning portion includes an approaching-distancing direction end in an approaching-distancing direction which is a direction perpendicular to a direction connecting the upper lid with the lower lid as well as a direction approaching or distancing with respect to the lower lid, and a regulation-direction one end and a regulation-direction other end in a regulation direction which is a direction connecting the upper lid with the lower lid as well as a direction perpendicular to the approaching-distancing direction.

3. The packing structure according to claim 2, wherein the device positioning portion includes:
at least one first device positioning portion having the approaching-distancing direction end, the regulation-direction one end, and the regulation-direction other end; and
at least one second device positioning portion having the approaching-distancing direction end which has a shape different from the at least one first device positioning portion.

4. The packing structure according to claim 1, further comprising a lower cushioning material on which the substrate storing container is placed in the packing box.

* * * * *